United States Patent
Liao

(10) Patent No.: US 9,484,937 B2
(45) Date of Patent: *Nov. 1, 2016

(54) TIME-TO-DIGITAL CONVERTER USING A CONFIGURABLE MULTIPLIER

(71) Applicant: TAIWAN SEMICONDUCTOR MANUFACTURING COMPANY, LTD., Hsinchu (TW)

(72) Inventor: Chia-Chun Liao, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/045,518

(22) Filed: Feb. 17, 2016

(65) Prior Publication Data

US 2016/0164530 A1  Jun. 9, 2016

Related U.S. Application Data

(63) Continuation of application No. 14/461,098, filed on Aug. 15, 2014, now Pat. No. 9,287,885.

(51) Int. Cl.
*H03L 7/00* (2006.01)
*H03L 7/099* (2006.01)
*G04F 10/00* (2006.01)
*H03L 7/085* (2006.01)
*H03L 7/081* (2006.01)

(52) U.S. Cl.
CPC ............ *H03L 7/0991* (2013.01); *G04F 10/005* (2013.01); *H03L 7/085* (2013.01); *H03L 7/0812* (2013.01); *H03L 2207/50* (2013.01)

(58) Field of Classification Search
None
See application file for complete search history.

(56) References Cited

U.S. PATENT DOCUMENTS

| 9,287,885 B2* | 3/2016 | Liao ............... G04F 10/005 |
| 2011/0148490 A1 | 6/2011 | Lee |
| 2013/0328604 A1 | 12/2013 | Matsuda |

* cited by examiner

*Primary Examiner* — Cassandra Cox
(74) *Attorney, Agent, or Firm* — Hauptman Ham, LLP

(57) ABSTRACT

A fractional error correction circuit includes a time-to-digital converter (TDC) configured to detect a phase difference between a reference clock signal and a variable clock signal, and a configurable multiplier coupled with the TDC. The configurable multiplier has a selectable bit size, the selectable bit size being based on a minimum number of bits needed to obtain a reciprocal of a period of the variable clock signal. The TDC is configured to output a fractional error correction value based on the detected phase difference and the reciprocal of the period.

20 Claims, 5 Drawing Sheets

TIME-TO-DIGITAL CONVERTER USING A CONFIGURABLE MULTIPLIER

PRIORITY CLAIM

The present application is a continuation of U.S. application Ser. No. 14/461,098, filed Aug. 15, 2014, which is incorporated herein by reference in its entirety.

BACKGROUND

An all-digital phase locked loop (ADPLL) is a circuit that locks the phase of a local oscillator clock, or variable clock signal, output from the ADPLL, to the phase of a reference clock signal. An ADPLL is a feedback system that adjusts the phase of the variable clock signal based on a phase difference between the variable clock signal and the reference clock signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
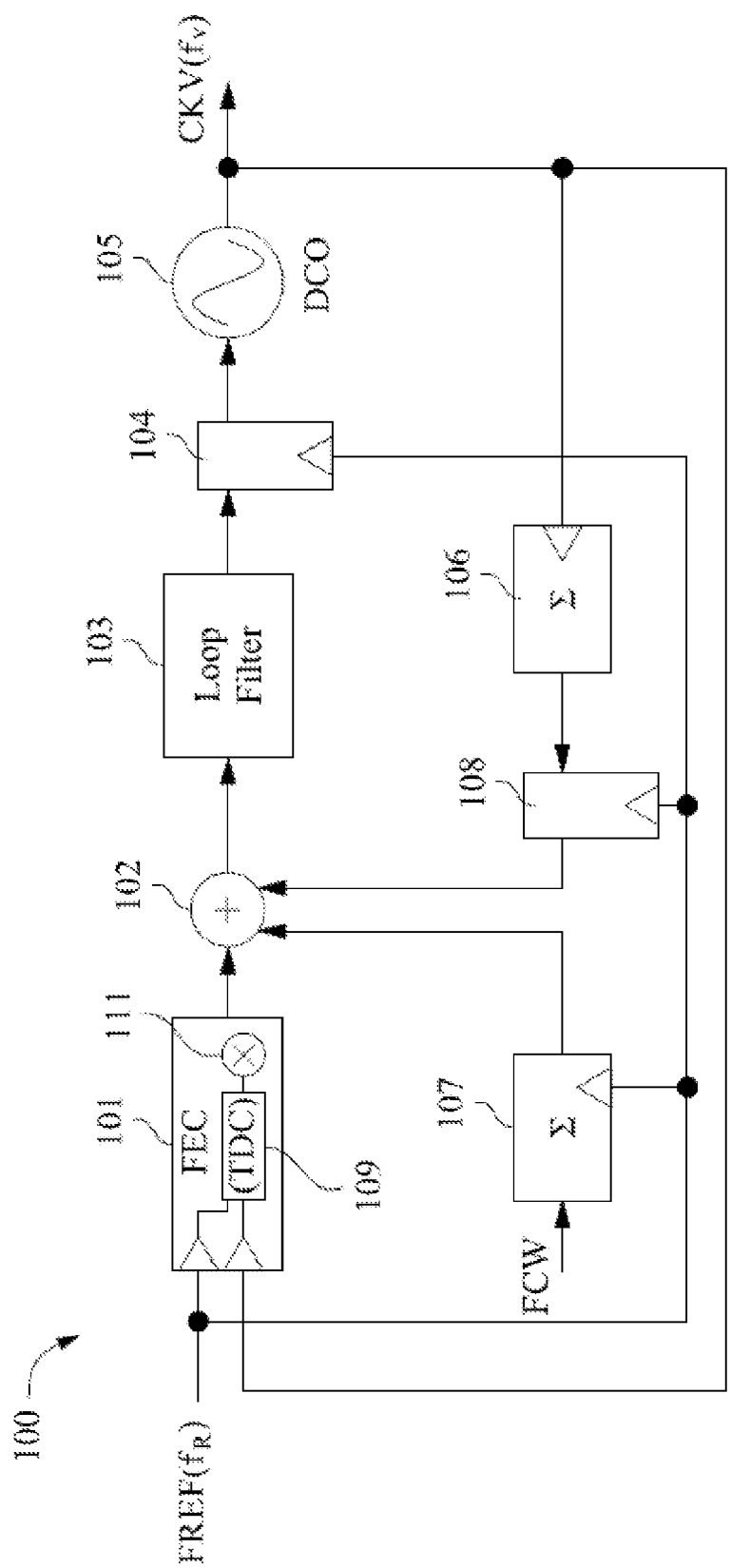
FIG. 1 is a diagram of an ADPLL, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An all-digital phase locked loop (ADPLL) is a circuit that locks the phase of a local oscillator clock, or variable clock signal, output from the ADPLL, to the phase of a reference clock signal. An ADPLL operates as a feedback system that feeds the variable clock signal back to a time-to-digital converter (TDC). The TDC determines a phase difference between the variable clock signal and the reference clock signal and, in response to the determined phase difference, causes, at least in part, a digital controlled oscillator (DCO) to adjust the phase of the variable clock signal.

Some ADPLL's delay the variable clock signal in the TDC and compare the variable clock signal with the reference clock signal to determine the phase difference. The TDC generates signals that reflect a variable clock period and the phase difference between the variable clock signal and the reference clock signal. Some TDC's or fractional error detection units use the generated signals to generate a fractional error signal that is used for ADPLL locking. For example, some TDC's generate a digital code based on the generated signals that reflect the variable clock period and the phase difference. The digital code is, for example, a sequence of binary digital code such as "1100011100" from which time within a clock cycle is capable of being interpreted and used to calculate a phase difference and a clock period. Some TDC's then calculate the fractional error based on the phase difference and a reciprocal of the variable clock period. For example, some TDC's apply the following equation to determine the fractional error:

$$\epsilon = 1 - \Delta t_r / T_v \quad (1)$$

where the phase difference is $\Delta t_r$ and the variable clock period is $T_v$.

To determine the reciprocal of the variable clock period $1/T_v$, some TDC's or fractional error detection units use the Newton-Raphson Method. For example, to find the inverse of a divisor D (i.e., to calculate 1/D), the Newton-Raphson method applies an iterative process that includes multiple multiplication steps for multiplicands, multipliers, divisors, dividends, and quotients that have corresponding bit sizes. A bit size is, for example, a quantity of bits that are required to represent a given number.

To accommodate the corresponding bit sizes of the divisors and the quotients, for example, some TDC's or fractional error detection units include a plurality of multipliers of differing bit sizes to perform various multiplication processes. For example, some TDC's or fractional error detection units include three multipliers to perform the Newton-Raphson method in order to determine the reciprocal of the variable clock period $1/T_v$. In addition, a number of the input bits for each multiplier is larger than necessary. A TDC or fractional error detection unit that includes numerous multipliers is complex and potentially error prone, causes ADPLL's to consume increased amounts of power, and causes ADPLL's to be physically larger than most market demands, which consumes valuable chip area.

An ADPLL that includes a TDC configured to transmit and receive data to reduce the bit size of multipliers, multiplicands, divisors, dividends, quotients and/or products, simplifies the Newton-Raphson method. Such an ADPLL reduces system complexity, which increases processing speeds, reduces power consumption, and/or enables reduction of the physical size of the ADPLL. For example, an ADPLL that includes a TDC that transmits and receives data to reduce the bit size as discussed herein enables the reduction of a physical size of the ADPLL by about 60% and reduction of the power consumption of the ADPLL by about 50%.

FIG. 1 is a diagram of an ADPLL 100, in accordance with one or more embodiments. ADPLL 100 comprises a fractional error correction unit 101 coupled directly or indirectly with a phase detector 102, a digital loop filter 103, first sampler circuit 104, a DCO 105, a DCO phase accumulator 106, a reference phase accumulator 107, and a second sampler circuit 108. An output of the fractional error correction unit 101 is coupled with a first input of the phase detector 102, an output of the reference phase accumulator 107 is coupled with a second input of the phase detector 102, and an output of the second sampler circuit 108 is coupled with a third input of the phase detector 102.

An output of the phase detector 102 is coupled with an input of the digital loop filter 103, an output of the digital loop filter 103 is coupled with a first input of the first sampler circuit 104, and an output of the first sampler circuit 104 is coupled with an input of the DCO 105. An output of the DCO 105 is coupled with an input of the DCO phase accumulator 106 and a first input of the fractional error correction unit 101. An output of the DCO phase accumulator 106 is coupled with a first input of the second sampler circuit 108.

A second input of the fractional error correction unit 101, a first input of the reference phase accumulator 107, a second input of the second sampler circuit 108, and a second input of the first sampler circuit 104 are configured to receive a reference clock signal FREF. A second input of the reference phase accumulator 107 is configured to receive a frequency control word FCW.

The fractional error correction unit 101 is configured to determine a phase difference $\alpha t_r$ and a fractional error correction value $\epsilon$ based on the reference clock signal FREF and a variable clock signal CKV output by DCO 105. The phase difference $\alpha t_r$ is the difference between the variable clock signal CKV rising clock edge and a reference clock signal FREF rising clock edge. The fractional error correction unit 101 comprises a time-to-digital converter (TDC) 109 configured to convert the phase difference $\alpha t_r$ from a time domain to a digital domain, and to output a digital code that is a binary representation of the phase difference $\alpha t_r$ and a variable clock period $T_v$.

A configurable multiplier 111 is coupled with the TDC 109. The fractional error correction unit 101 includes the configurable multiplier 111. In some embodiments, the configurable multiplier 111 is outside of the fractional error correction unit 101. The configurable multiplier 111 has a selectable bit size for inputting numbers or code to be multiplied. The selectable bit size is based on a defined minimum number of bits needed to obtain a reciprocal of a variable clock period $1/T_v$ within a predetermined error threshold. The minimum number of bits is based on a comparison of a first number of bits of a divisor with a second number of bits of a quotient. The TDC 109 multiplies the digital code by the reciprocal of the variable clock period $1/T_v$ to output the fractional error correction value $\epsilon$ using equation (1). In some embodiments, the TDC 109 uses the configurable multiplier 111 to multiply the digital code by the reciprocal of the variable clock period $1/T_v$. In other embodiments, the TDC 109 is itself configured to multiply the digital code by the reciprocal of the variable clock period $1/T_v$.

The reference phase accumulator 107 receives the frequency control word FCW and generates an accumulation of a frequency control word FCW of the reference clock signal FREF. The frequency control word FCW is a ratio of an expected or desirable carrier frequency $F_{RF}$ to the reference clock signal FREF (i.e., FCW=$F_{RF}$/FREF). The reference phase accumulator 107 is configured to accumulate the frequency control work FCW over time and to output the accumulated frequency control word FCW as a reference phase signal PHR. In some embodiments, the reference phase accumulator 107 accumulates the frequency control word FCW for the reference clock signal FREF on every rising edge of the reference clock signal FREF. In some embodiments, the reference phase accumulator 107 is a component of the fractional error correction unit 101.

The DCO phase accumulator 106 is configured to receive the variable clock signal CKV and accumulates edge clock transitions for the variable clock signal CKV. The DCO phase accumulator 106 outputs a variable phase signal PHV that is sampled by the second sampler circuit 108.

The phase detector 102 receives the fractional error correction value $\epsilon$ the reference phase signal PHR, and the variable phase signal PHV. The phase detector 102 is a summation element that is configured to determine and to output a phase error PHE between the received reference clock signal FREF and the received variable clock signal CKV by adding the fractional error correction value $\epsilon$ to the reference phase signal PHR and subtracting the variable phase signal PHV.

The digital loop filter 103 is configured to receive the phase error PHE and to generate a control word CW from the phase error PHE. The digital loop filter 103 outputs the control word CW. The first sampler circuit 104 is configured to receive the control word CW en route to the DCO 105, sample the control word CW, and to output the control word CW. The DCO 105 is configured to receive the control word CW and to vary a frequency of the variable clock signal CKV based on the control word CW. Over a plurality of clock cycles, the control word CW drives the ADPLL 100 to enter a locked state by minimizing the phase error PHE.

Figure 2:
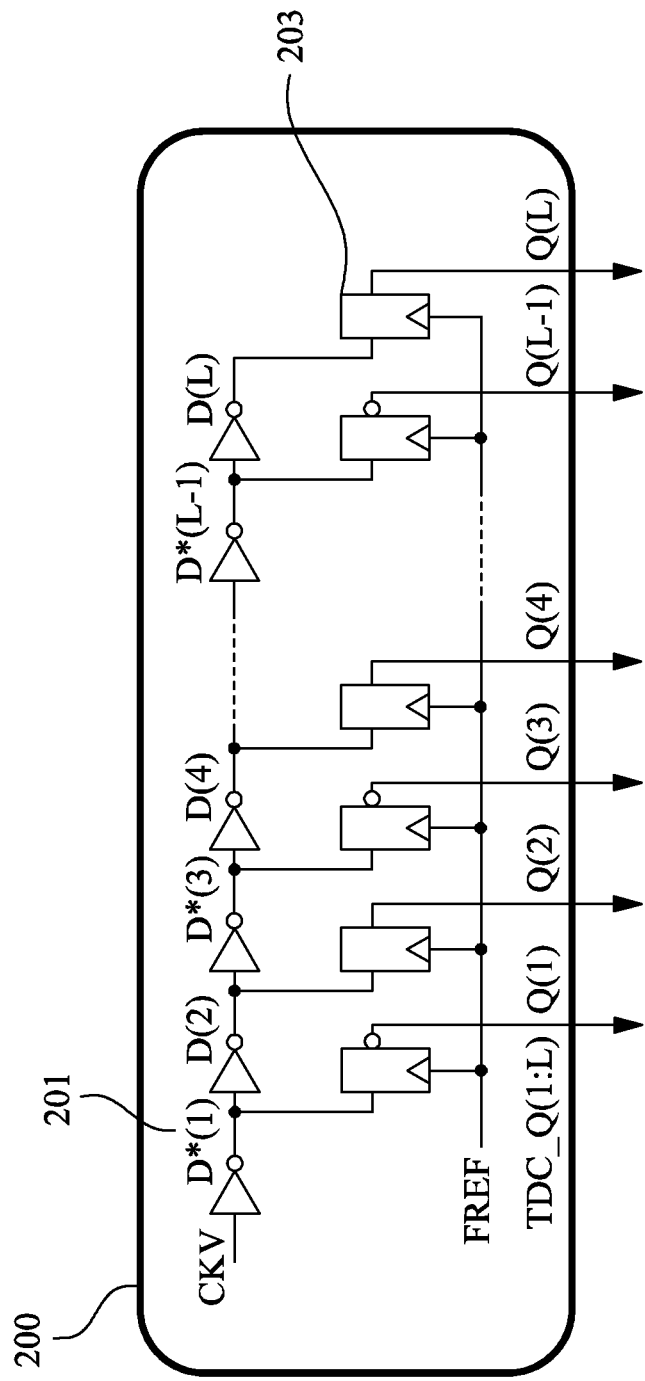
FIG. 2 is a diagram of a TDC, in accordance with one or more embodiments.

FIG. 2 is a diagram of a TDC 200, in accordance with one or more embodiments. TDC 200 is an example embodiment of the TDC 109 (FIG. 1). TDC 200 includes one or more delay elements 201 coupled with one or more signal sampling elements 203. The one or more delay elements 201 are configured to receive the variable clock signal CKV, and comprise, for example, one or more inverters. The one or more signal sampling elements 203 are configured to receive reference clock signal FREF, and comprise, for example, one or more flip-flop circuits. The one or more signal sampling elements 203 receive the variable clock signal CKV by way of the one or more delay elements 201. In some embodiments, the reference clock signal FREF is used by the one or more signal sampling elements 203, or flip-flops, the variable clock signal CKV is received by the one or more signal sampling elements 203, and the reference clock signal FREF is used by the one or more signal sampling elements 203. The one or more signal sampling elements 203 are configured to compare the reference clock signal FREF with the variable clock signal CKV, and to output digital code Q(1) ... Q(L) that represents the phase difference $\alpha t_r$ and the variable clock period $T_v$, and/or the reciprocal thereof, in binary form.

Figure 3:
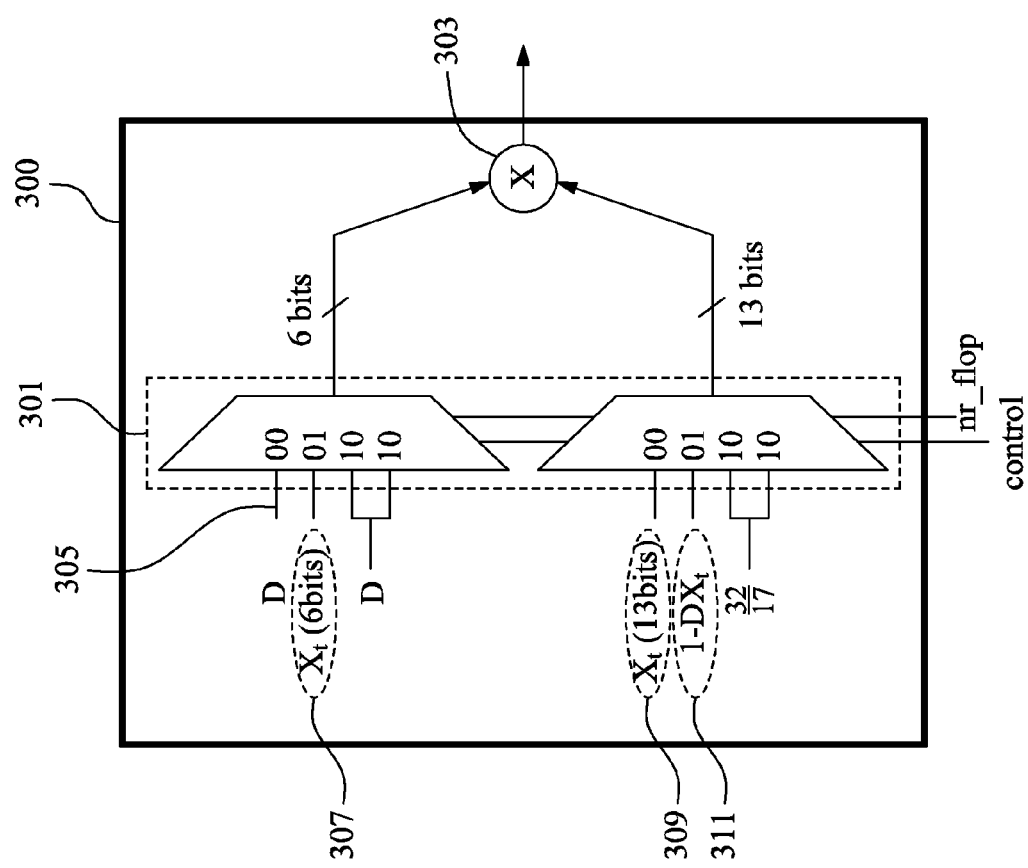
FIG. 3 is a diagram of a configurable multiplier, in accordance with one or more embodiments.

FIG. 3 is a diagram of a configurable multiplier 300, in accordance with one or more embodiments. The configurable multiplier 300 is an example embodiment of the configurable multiplier 111 (FIG. 1). The configurable multiplier 300 includes a multiplexer 301 and a multiplier module 303. The configurable multiplier 300 is coupled with a TDC such as TDC 109 (FIG. 1) by way of the multiplexer 301. The multiplexer 301 enables control of the bit sizes of the configurable multiplier 300. TDC 109 is configured to receive and send data such as a control signal and an nr_flop signal for controlling the configurable multiplier 300. The multiplexer 301 receives the control signal and the nr_flop signal from the TDC 109 for controlling the multiplier 300. The multiplexer 301 control signals, control and nr_flop, are controlled by a digital controller. In some embodiments, the digital controller is built-into TDC 109. The multiplexer 301 couples one or more lines 305 with the multiplier module 303 to perform a given operation as based on a logical (e.g. logic high or logic low) condition combination of the control signal and the nr_flop signal.

The TDC 109, together with the configurable multiplier 300, are used to determine the reciprocal of the variable clock period $1/T_v$ by conducting at least two iterations of the Newton-Raphson method using a divisor D representative of the variable clock period $T_v$ and a quotient $X_i$, $X_{i+1}$, with truncated bit numbers to simplify and optionally reuse the configurable multiplier 300 for more than one multiplication operation.

The quotient Xi has a first number of bits 307, and the divisor D has a second number of bits 309. The control signal and the nr_flop signal are communicated to the multiplexer 301 by way of the TDC 109 and cause the first number of bits 307 to be less than or equal to a third number of bits 311 of 1−DXi. The control signal and the nr_flop signal cause the configurable multiplier 300 to be set to the minimum number of bits. In some embodiments, the control signal and the nr_flop signal received by way of the TDC 109 maintain the minimum number of bits through at least two iterations of determining the reciprocal of the variable clock period $1/T_v$. The minimum number of bits is determined based on a predetermined threshold deviation from the fractional error correction value $\epsilon$.

At least two iterations of determining the reciprocal of the variable clock period $1/T_v$ are conducted using the TDC 109 and the configurable multiplier 300. The at least two iterations comprise a first iteration and a second iteration. The first iteration comprises estimating the reciprocal of the variable clock period $1/T_v$ by causing the configurable multiplier 300 to calculate 32/17D. The second iteration comprises estimating the reciprocal of the variable clock period $1/T_v$ by causing the configurable multiplier 300 to calculate DXi.

In some embodiments, a third iteration of determining the reciprocal of the variable clock period $1/T_v$ is conducted using the TDC 109 and the configurable multiplier 300. The third iteration of determining the reciprocal of the variable clock period $1/T_v$ comprises estimating the reciprocal of the variable clock period $1/T_v$ by causing the configurable multiplier 300 to calculate Xi(1−DXi).

The first iteration generates a first estimate of the reciprocal of the variable clock period $1/T_v$. The second iteration generates a second estimate of the reciprocal of the variable clock period $1/T_v$ based on the first estimate of the reciprocal of the variable clock period $1/T_v$. The third iteration generates a third estimate of the variable clock period $1/T_v$ based on the second estimate of the reciprocal of the variable clock period $1/T_v$. The number of iterations conducted to determine the reciprocal of the variable clock period $1/T_v$ is based on the minimum bit number to determine a reciprocal of the variable clock period $1/T_v$ that would generate a fractional error correction value $\epsilon$ within the predetermined threshold deviation.

An example of the operation of the configurable multiplier 300 is detailed as follows. If a divisor D has $N_D$ bits, and a quotient $X_{i+1}$ has $N_X$ bits, the multiplier 300 is configured to be a $N_D$ bits by $N_X$ bits multiplier. For example, given $N_D$=6 bits and $N_X$=13 bits, the control signal and the nr_flop signal received by way of the TDC 109 cause the configurable multiplier 300 to be a 6 bits by 13 bits multiplier. To determine the reciprocal of the variable clock period $1/T_v$ using the Newton-Raphson method as simplified by the TDC 109 and the configurable multiplier 300, the multiplier bit numbers are reduced, as caused by the control signal and the nr_flop signal, from Nx by ($N_D$+$N_X$) bits to $N_D$ by $N_X$ (or from 13 by 19 bits to 6 by 13 bits).

Taken further, if 32/17 has Nx bits, or in this example, 13 bits, and D has $N_D$ bits, or in this example, 6 bits, then the following equation results in a value having 13 by 6 bits.

$$X_0 = \frac{48}{17} - \frac{32}{17}D \qquad (2)$$

Normally, the following equation would result in a value having 13 by 19 bits. But, the control signal and the nr_flop signal cause the following equation to result in a value having only 6 by 13 bits.

$$X_{i+1}=X_i+X_i(1-DX_i) \qquad (3)$$

The control signal and the nr_flop signal, as communicated by way of the TDC 109, cause the multiplexer 301 to keep the bit numbers of $1-DX_i$ equal to or larger than $N_X$ to ensure the accuracy of $X_{i+1}$ having $N_X$ bits accuracy.

The determined bit numbers influence the number of iterations that are conducted using the TDC 109 and the configurable multiplier 300 to determine the reciprocal of the variable clock period $1/T_v$ with sufficient accuracy for the TDC 109 to determine the fractional error correction value $\epsilon$ within the predetermined threshold deviation from the fractional error correction value $\epsilon$. In some embodiments, if the number of bits of $X_i$ is instructed to be equal to $N_D$ bits, the configurable multiplier 300 is reusable without receiving an instruction from the TDC 109.

In another example to demonstrate the reduction of bit numbers in decimal form, the bit numbers of the configurable multiplier 300 are reduced as follows:

If, $X_i$=1.529

$DX_i$=1.051

$1-DX_i$=−0.051

$2-DX_i$=0.949

Solving for $X_{i+1}=X_i(2-DX_i)$, which is equation (3) rewritten in simplified form, would conventionally yield:

$X_{i+1}$=1.529×0.949

$X_{i+1}$=1.451021

But, the control signal and the nr_flop signal cause the bit numbers to be minimized. Accordingly, the configurable multiplier 300 is caused to have a reduced number of bits to simplify the determination of $X_{i+1}$. As such, the number of bits of $X_i$ is reduced in this example by one bit, and the multiplication result is as follows:

$X_{i+1}$=1.52×0.949

$X_{i+1}$=1.44248

Similarly, if the TDC 109 and the multiplier 300 are used to solve for $X_{i+1}=X_i+X_i(1-DX_i)$, $X_{i+1}$=1.529+1.52×(−0.051)

$X_{i+1}$=1.45148

In each of the above examples, the number of bits of the resulting quotient $X_{i+1}$ is reduced in quantity, which reduces processing time, complexity, and power and memory usage of the ADPLL 100, as well as an area of a chip consumed by the ADPLL 100.

Figure 4:
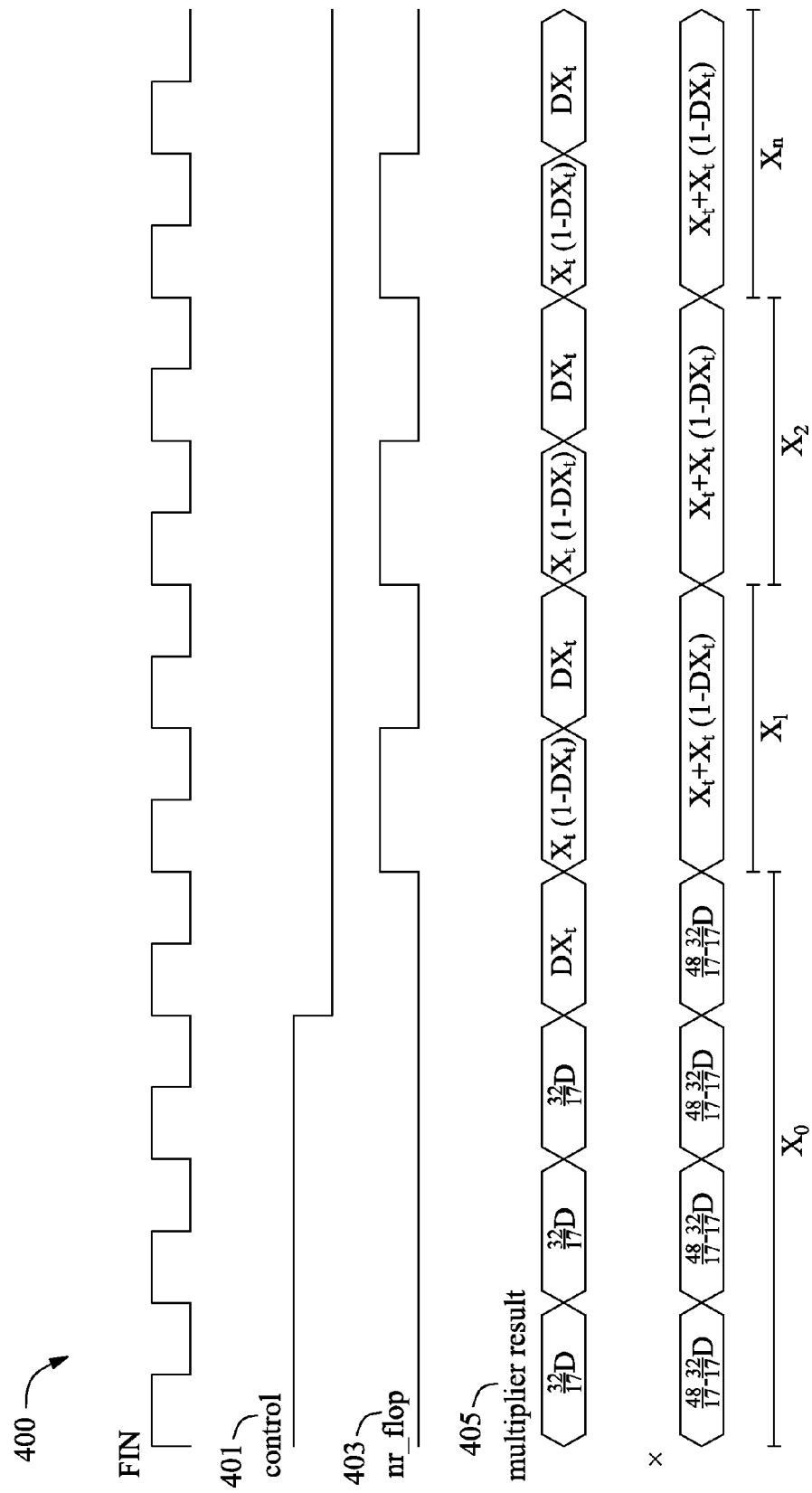
FIG. 4 is a timing diagram, in accordance with one or more embodiments.

FIG. 4 is a timing diagram 400, in accordance with one or more embodiments. The timing diagram 400 depicts that the configurable multiplier 111 (FIG. 1) is controlled by a control signal 401 and a nr_flop signal 403 such that particular multiplier results 405 or equations X are used by the TDC 109 (FIG. 1) and the configurable multiplier 111 for particular periods of $X_0$, $X_1$, $X_2$, $X_n$ with respect to an instruction associated with a logic condition of the control signal 401 and the nr_flop signal 403. For example, the equation and multiplier result used by the TDC 109 and the configurable multiplier 111 changes based on logical condition combinations such as whether the control signal 401 is at a logical high and the nr_flop signal 403 is at a logical high, the control signal 401 is at a logical high and the nr_flop signal 403 is at a logical low, the control signal 401 is at a logical low and the nr_flop signal 403 is at a logical high, or the control signal 401 is at a logical low and the nr_flop signal 403 is at a logical low.

Figure 5:
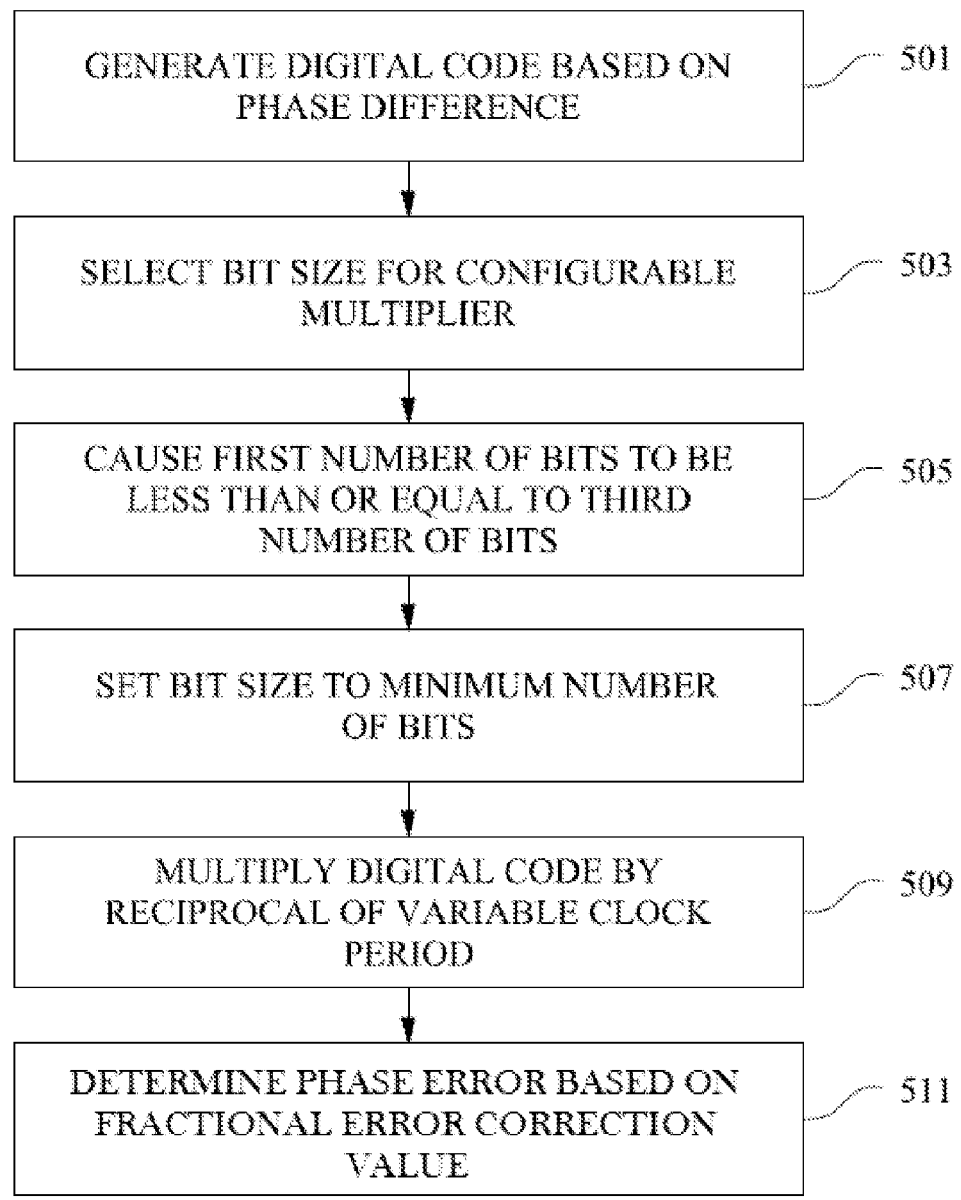
FIG. 5 is a flowchart of a method performed by an ADPLL, in accordance with one or more embodiments.

FIG. 5 is a flowchart of a method 500 performed by an ADPLL such as ADPLL 100 (FIG. 1), in accordance with one or more embodiments.

In step 501, a digital code is generated by a TDC such as TDC 109 (FIG. 1), based on a phase difference between a reference clock signal and a variable clock signal.

In step 503, a bit size of a configurable multiplier such as configurable multiplier 111 (FIG. 1) is set based on a signal instruction received by way of the TDC. The bit size selected is based on a determined minimum number of bits to obtain a reciprocal of a variable clock period. The minimum number of bits is based on a comparison of a first number of bits of a divisor with a second number of bits of a quotient.

In step 505, the first number of bits of the quotient is caused to be less than or equal to a third number of bits of an equation $1-DX_i$, where D is the divisor and $X_i$ is the quotient.

In step 507, the bit size of the configurable multiplier is caused to be set to the minimum number of bits, and the minimum number of bits is maintained through at least two iterations of determining the reciprocal of the variable clock period. The at least two iterations of determining the reciprocal of the variable clock period comprise a first iteration and a second iteration. The first iteration comprises estimating the reciprocal of the variable clock period by causing the configurable multiplier to calculate 32/17D. The second iteration comprises estimating the reciprocal of the variable clock period by causing the configurable multiplier to calculate $DX_i$. A third iteration comprises estimating the reciprocal of the variable clock period by causing the configurable multiplier to calculate the equation $Xi(1-DX_i)$. The first iteration determines a first estimate of the reciprocal of the variable clock period, the second iteration determines a second estimate of the reciprocal of the variable clock period based on the first estimate of the reciprocal of the variable clock period, and the third iteration determines a third estimate of the reciprocal of the variable clock period based on the second estimate of the reciprocal of the variable clock period.

In step 509, the TDC multiplies the digital code by the reciprocal of the variable clock period to output a fractional error correction value.

In step 511, a phase detector such as phase detector 102 (FIG. 1) determines a phase error based, at least in part, on the fractional error correction value. The phase error is used as a basis for varying a frequency of the variable clock signal.

In some embodiments, a fractional error correction circuit comprises a time-to-digital converter (TDC) configured to detect a phase difference between a reference clock signal and a variable clock signal, and a configurable multiplier coupled with the TDC. The configurable multiplier has a selectable bit size, the selectable bit size being based on a minimum number of bits needed to obtain a reciprocal of a period of the variable clock signal. The TDC is configured to output a fractional error correction value based on the detected phase difference and the reciprocal of the period.

In some embodiments, a method performed by a fractional error correction circuit comprises detecting, using a time-to-digital converter (TDC), a phase difference between a reference clock signal and a variable clock signal, controlling, using the TDC, a bit size of a configurable multiplier to obtain a reciprocal of a period of the variable clock signal, the bit size being selected based on a minimum number of bits, and calculating, using the TDC and the configurable multiplier, a fractional error correction value based on the detected phase difference and the reciprocal of the period.

In some embodiments, an all digital phase locked loop, comprises a time-to-digital converter (TDC) configured to receive a reference clock signal and a variable clock signal, and output a fractional error correction value based on the reference clock signal and the variable clock signal, and a digital controlled oscillator configured to control the variable clock signal based on the fractional error correction value. The TDC is configured to calculate the fractional error correction value by controlling a bit size of a configurable multiplier coupled with the TDC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fractional error correction circuit, comprising:
    a time-to-digital converter (TDC) configured to detect a phase difference between a reference clock signal and a variable clock signal; and
    a configurable multiplier coupled with the TDC, the configurable multiplier having a selectable bit size, the selectable bit size being based on a minimum number of bits needed to obtain a reciprocal of a period of the variable clock signal,
    wherein the TDC is configured to output a fractional error correction value based on the detected phase difference and the reciprocal of the period.

2. The fractional error correction circuit of claim 1, wherein the minimum number of bits is based on a predetermined threshold deviation from the fractional error correction value.

3. The fractional error correction circuit of claim 1, wherein the minimum number of bits needed to obtain the reciprocal of the period of the variable clock signal is the minimum number of bits needed to obtain the reciprocal of the period of the variable clock signal with at least two iterations of a Newton-Raphson method.

4. The fractional error correction circuit of claim 1, wherein the TDC is configured to use the configurable multiplier for more than one multiplication operation.

5. The fractional error correction circuit of claim 4, wherein the TDC is configured to maintain the minimum number of bits for the more than one multiplication operation.

6. The fractional error correction circuit of claim 1, wherein the configurable multiplier comprises a multiplexer configured to enable bit size control in response to a pair of control signals.

7. The fractional error correction circuit of claim 6, wherein the TDC comprises a digital controller configured to control the pair of control signals.

8. A method performed by a fractional error correction circuit, the method comprising:
 detecting, using a time-to-digital converter (TDC), a phase difference between a reference clock signal and a variable clock signal;
 controlling, using the TDC, a bit size of a configurable multiplier to obtain a reciprocal of a period of the variable clock signal, the bit size being selected based on a minimum number of bits; and
 calculating, using the TDC and the configurable multiplier, a fractional error correction value based on the detected phase difference and the reciprocal of the period.

9. The method of claim 8, wherein the minimum number of bits is based on a predetermined threshold deviation from the fractional error correction value.

10. The method of claim 8, wherein calculating the fractional error correction value comprises using the configurable multiplier for more than one multiplication operation.

11. The method of claim 10, wherein using the configurable multiplier for more than one multiplication operation comprises using the configurable multiplier for at least two iterations of a Newton-Raphson method.

12. The method of claim 11, wherein the minimum number of bits needed to obtain the reciprocal of the period of the variable clock signal is the minimum number of bits needed to obtain the reciprocal of the period of the variable clock signal with the at least two iterations of a Newton-Raphson method.

13. The method of claim 10, wherein using the configurable multiplier for more than one multiplication operation comprises maintaining the minimum number of bits for the more than one multiplication operation.

14. An all digital phase locked loop, comprising:
 a time-to-digital converter (TDC) configured to receive a reference clock signal and a variable clock signal, and output a fractional error correction value based on the reference clock signal and the variable clock signal; and
 a digital controlled oscillator configured to control the variable clock signal based on the fractional error correction value,
 wherein the TDC is configured to calculate the fractional error correction value by controlling a bit size of a configurable multiplier coupled with the TDC.

15. The all digital phase locked loop of claim 14, wherein the TDC is configured to control the bit size of the configurable multiplier based on a minimum number of bits needed to obtain a reciprocal of a period of the variable clock signal.

16. The all digital phase locked loop of claim 15, wherein the minimum number of bits is based on a predetermined threshold deviation from the fractional error correction value.

17. The all digital phase locked loop of claim 15, wherein the minimum number of bits needed to obtain the reciprocal of the period of the variable clock signal is the minimum number of bits needed to obtain the reciprocal of the period of the variable clock signal with at least two iterations of a Newton-Raphson method.

18. The all digital phase locked loop of claim 14, wherein the TDC is configured to use the configurable multiplier for more than one multiplication operation.

19. The all digital phase locked loop of claim 18, wherein the TDC is configured to maintain the minimum number of bits for the more than one multiplication operation.

20. The all digital phase locked loop of claim 14, further comprising a phase detector configured to receive the fractional error correction value and output a phase error based on the fractional error correction value, wherein the digital controlled oscillator is configured to control the variable clock signal based on the phase error.

* * * * *